United States Patent [19]
Thornton et al.

[11] Patent Number: 5,216,443
[45] Date of Patent: Jun. 1, 1993

[54] PROGRAMMABLE INTENSITY SMART LASER SYSTEM CAPABLE OF BEING FABRICATED ON A SEMICONDUCTIVE SUBSTRATE

[75] Inventors: Robert L. Thornton, East Palo Alto; Douglas N. Curry, Menlo Park, both of Calif.

[73] Assignee: Xerox Corporation, Stamford, Conn.

[21] Appl. No.: 896,845

[22] Filed: Jun. 12, 1992

[51] Int. Cl.⁵ .................... H01S 3/10; G03G 15/04
[52] U.S. Cl. ................................ 346/108; 358/298; 372/38
[58] Field of Search .................. 346/108, 76 L, 160; 358/298; 372/38

[56] References Cited

U.S. PATENT DOCUMENTS

| | | | |
|---|---|---|---|
| 4,384,297 | 5/1983 | Ohara et al. | 346/108 |
| 4,539,685 | 9/1985 | Hart et al. | 372/25 |
| 4,727,382 | 2/1988 | Negishi et al. | 346/108 |
| 4,878,225 | 10/1989 | Aiba et al. | 372/38 |
| 4,893,136 | 1/1990 | Curry | 346/108 |
| 4,987,468 | 1/1991 | Thornton | 357/34 |
| 4,995,049 | 2/1991 | Kahen et al. | 372/38 X |
| 5,038,185 | 8/1991 | Thornton | 357/17 |
| 5,048,040 | 9/1991 | Paoli | 372/50 |
| 5,170,403 | 12/1992 | Mayer | 372/38 X |

*Primary Examiner*—Joan H. Pendegrass
*Attorney, Agent, or Firm*—Oliff & Berridge

[57] ABSTRACT

A laser recorder for recording images on a substrate in response to a video signal having a frequency which defines a pixel time (during which a single pixel is imaged) includes a duty cycle modulating digital to analog (D/A) converter which outputs a variable duty cycle high frequency signal, based upon an intensity controlling N-bit input, to a power controller which then controls the intensity of a light beam output by a laser based upon the variable duty cycle high frequency signal. The duty cycle modulating D/A converter outputs a high frequency variable duty cycle bitstream including a repeating cycle of fixed amplitude pulses, a total duration of all of the pulses in each cycle varying based upon the N-bit input signal. The high frequency of the variable duty cycle is sufficiently high so that the cycle of fixed amplitude pulses repeats multiple times within each pixel time, so that the intensity level with which pixels are formed on a substrate varies based upon the number of pulses output during each pixel time and the total duration of all pulses in each cycle. Preferably, the laser, power controller, and duty cycle modulating D/A converter are formed in a common semiconductive substrate. A detector for detecting the intensity of light output by the laser is also preferably formed in the common semiconductive substrate, and provides feedback to the power controller. In a preferred embodiment, the duty cycle modulating D/A converter varies the total duration of the fixed amplitude pulse within a cycle by varying a number of fixed amplitude, fixed width pulses output during each cycle based upon the N-bit input signal.

21 Claims, 7 Drawing Sheets

| CLOCK | D = 0 | D = 1 | D = 2 | D = 3 |
|---|---|---|---|---|
| 0 | 0 | 0 | 0 | 0 |
| 1 | 0 | 1 | 2 | 3 |
| 2 | 0 | 2 | 4 | 6 $C_{out}$ |
| 3 | 0 | 3 | 6 $C_{out}$ | 1 |
| 4 | 0 | 4 | 0 | 4 |
| 5 | 0 | 5 | 2 | 7 $C_{out}$ |
| 6 | 0 | 6 | 4 | 2 |
| 7 | 0 | 7 $C_{out}$ | 6 $C_{out}$ | 5 $C_{out}$ |
| 8 | 0 | 0 | 0 | 0 |
| 9... | | | | |

| CLOCK | D = 4 | D = 5 | D = 6 | D = 7 |
|---|---|---|---|---|
| 0 | 0 | 0 | 0 | 0 $C_{out}$ |
| 1 | 4 $C_{out}$ | 5 $C_{out}$ | 6 $C_{out}$ | 7 $C_{out}$ |
| 2 | 0 | 2 | 4 $C_{out}$ | 6 $C_{out}$ |
| 3 | 4 $C_{out}$ | 7 $C_{out}$ | 2 $C_{out}$ | 5 $C_{out}$ |
| 4 | 0 | 4 $C_{out}$ | 0 | 4 $C_{out}$ |
| 5 | 4 $C_{out}$ | 1 | 6 $C_{out}$ | 3 $C_{out}$ |
| 6 | 0 | 6 $C_{out}$ | 4 $C_{out}$ | 2 $C_{out}$ |
| 7 | 4 $C_{out}$ | 3 $C_{out}$ | 2 $C_{out}$ | 1 $C_{out}$ |
| 8 | 0 | 0 | 0 | 0 $C_{out}$ |
| 9... | | | | |

FIG. 4

PROGRAMMABLE INTENSITY SMART LASER SYSTEM CAPABLE OF BEING FABRICATED ON A SEMICONDUCTIVE SUBSTRATE

BACKGROUND OF THE INVENTION

1. Field of the Invention

The present invention is directed to laser recorders for producing images on a substrate, and in particular, to laser recorders which are capable of printing with grey scales.

2. Description of Related Art

It is widely recognized that printing with grey scale techniques can offer substantial advantages in terms of image storage and process speed over high resolution bitmap techniques. The ability to create precisely intensity controlled levels in a laser is also important for the realization of novel schemes for high addressability in laser printing. This is particularly the case in the printing of half tone images where the required resolution necessitates extremely high resolution bitmap images, or the application of enhanced addressability techniques.

One issue of considerable concern in the realization of light sources for grey scale printers and high addressability printers is the precise control of the intensity of the (typically laser) light source to provide for precise levels of grey or precise edge position control. This becomes a problem of increasing severity as the number of levels desired increases.

Most techniques for varying intensity rely on precisely varying the forward bias current to the light emitting device in order to vary the light emission. In this scenario, shifts in the L-I characteristic of the device result in a need to re-calibrate the current levels needed for each of the intensity levels.

An example of a laser beam printer which provides grey scales by varying the forward bias current is provided in U.S. Pat. No. 4,727,382 to Negishi et al. The laser printer disclosed in U.S. Pat. No. 4,727,382 includes a controller which receives an N-bit word which is used to look-up a forward bias current value in a ROM. The forward bias current level found in the ROM is then supplied to the laser so that the intensity of light produced by the laser is controlled based upon the value of the N-bit input word. A feedback circuit is also provided.

U.S. Pat. No. 4,384,297 to Ohara et al discloses a laser recorder for producing a picture having half-tones of high accuracy, wherein an analog input video signal is sampled at a predetermined frequency. Each time the input video signal is sampled, a burst of high frequency pulses are output to drive a laser. Each burst of high frequency pulses is output synchronized with each pixel time so that the number of high frequency pulses output in each burst controls the intensity of light output by the laser. The high frequency pulses all have the same amplitude, and are centered about the sampling pulse (within each pixel time).

U.S. Pat. No. 4,384,297 requires each burst of high frequency pulses to be synchronized with the video signal so that each burst of high frequency pulses is centered within a pixel frame. This requires synchronization circuitry, which adds to the complexity of the control system. Additionally, because the high frequency pulses are not generated on the same semiconductive substrate (chip) as the laser, off-chip high frequency connections between the laser and the high frequency pulse generator are required. Off-chip generation of high frequency pulses creates difficulties due to lead inductance and parasitic capacitance.

Other patents of interest include U.S. Pat. No. 4,539,685 to Hart et al and U.S. Pat. No. 4,893,136 to Curry. U.S. Pat. No. 4,539,685 discloses a passively Q-switched laser having a variable pulse rate wherein the duration of the laser power pulse and the time interval between laser power pulses are variable. A detector is provided for detecting an output laser pulse and feeding it back to a controller. U.S. Pat. No. 4,893,136 discloses an arithmetically computer motor hunt compensation system wherein a variable frequency clock controls a buffer which is receiving data samples. The data samples are representative of individual dots of a halftone image.

U.S. Pat. No. 4,987,468 to Thornton and U.S. Pat. No. 5,038,185 to Thornton disclose techniques for integrating transistors, detectors, and lasers onto a common semiconductive substrate.

In particular, U.S. Pat. No. 4,987,468 discloses a lateral heterojunction bipolar transistor (LHBT) which can also be used as a hetero transverse junction (HTJ) laser. See, for example, col. 2, lines 53–63 of that patent. The LHBT includes emitter and/or collector regions forming p-n heterojunctions at the emitter/base junction and at the collector/base junction with a planar base region, wherein at least the emitter region is formed by employing impurity induced disordering (IID) to produce an emitter or collector region of wider bandgap than the base region. When the collector p-n junction is forward biased (i.e., is driven into saturation by forward biasing both the emitter/base and the collector/base p-n junctions or sufficiently forward biasing one of these junctions) the carrier density in the base region builds to sufficiently high levels to exhibit stimulated emission gain and bring about lasing action. The intensity of the light beam output by the laser can be varied by sufficiently forward biasing one of the emitter/base and collector/base junctions to bring about lasing (e.g., by supplying a current in the 6–10 mA range) and by modulating a current in the nA to mA range and modulating the voltage (e.g., 0–1.2 volt) supplied to the other one of the emitter/base and collector/base junctions to modulate the emission properties (intensity) of the transistor/laser. See col. 5, line 1–col. 6, line 23 of that patent.

U.S. Pat. No. 5,038,185 discloses transistors and lasers integrated in a common epitaxial layer of a semiconductive substrate. More specifically, compound semiconductor (such as AlGaAs) surface skimming heterotransverse junction (HTJ) lasers and improved heterojunction bipolar transistors (L-HBTs) are disclosed. The surface skimming characteristic of these HTJ lasers enables them to be configured relatively easily, without requiring any epitaxial regrowth, to operate as distributed feedback (DFB) lasers in axial or surface emitting configurations and to function as harmonic generators. The device acts as a transistor when its collector/base junction is reverse biased and its emitter/base junction is forward biased. The device acts as a single quantum well HTJ laser when its collector/base and emitter/base junctions are both forwardly biased sufficiently to cause the carrier density in its active base region to build to a level at which stimulated emission is initiated. The possibility of optoelectronic integration with the laser is also recognized, although no circuitry is disclosed. See col. 3, lines 25-35 and col. 8, lines 35-38.

The disclosures of U.S. Pat. Nos. 4,987,468 and 5,038,185 are incorporated herein by refernce. However, neither of these references discloses the grey scale or power control circuitry provided by the present invention.

U.S. Pat. No. 5,048,040 to Paoli, the disclosure of which is incorporated herein by reference, discloses a multiple wavelength semiconductor laser. Several lasers operating at different wavelengths are integrated into a single chip. See col. 1, lines 53-63.

OBJECTS AND SUMMARY OF THE INVENTION

It is an object of the present invention to provide a laser recorder having control circuitry for monitoring and controlling laser emission which is integrated on-chip with the laser.

It is another object of the present invention to provide a laser recorder wherein precise levels of grey scale or laser intensity gradation is provided without varying a forward bias current supplied to a semiconductor laser.

It is another object of the present invention to provide a laser recorder capable of producing precise levels of grey scale based upon a digital input signal wherein a relatively simple digital to analog conversion is performed by the digital duty cycle control of a laser diode modulated with a very high frequency digital pulse stream, wherein the high frequency digital pulse (bitstream) is produced asynchronously with the input video signal.

It is a further object of the present invention to provide a laser recorder having a control system that provides for precise levels of grey scale and feedback control without varying a forward bias current supplied to a laser, and wherein only relatively narrow bandwidth data inputs are required into the chip containing the laser and control circuitry.

To achieve the foregoing and other objects, and to overcome the shortcomings discussed above, a laser recorder for recording images on a substrate in response to a video signal having a frequency which defines a pixel time (during which a single pixel is imaged) includes a duty cycle modulating digital to analog (D/A) converter which outputs a variable duty cycle high frequency signal, based upon an intensity controlling N-bit input, to a power controller which then controls the intensity of a light beam output by a laser based upon the variable duty cycle high frequency signal. The duty cycle modulating D/A converter outputs a high frequency variable duty cycle bitstream including a repeating cycle of fixed amplitude pulses, a total duration of all of the pulses in each cycle varying based upon the N-bit input signal. The high frequency of the variable duty cycle is sufficiently high so that the cycle of fixed amplitude pulses repeats multiple times within each pixel time, so that the intensity level with which pixels are formed on a substrate varies based upon the number of pulses output during each pixel time and the total duration of all pulses in each cycle.

Preferably, the laser, power controller, and duty cycle modulating D/A converter are formed in a common semiconductive substrate. A detector for detecting the intensity of light output by the laser is also preferably formed in the common semiconductive substrate, and provides feedback to the power controller.

In a preferred embodiment, the duty cycle modulating D/A converter varies the total duration of the fixed amplitude pulse within a cycle by varying a number of fixed amplitude, fixed width pulses output during each cycle based upon the N-bit input signal.

Because the cycle repeats itself multiple times during a pixel time, the high frequency variable duty cycle bitstream can be asynchronous with the video signal. This eliminates the need for circuitry to synchronize the high frequency duty cycle signal with the video signal, further facilitating the integration of the duty cycle modulating D/A converter with the laser and power controller in the common semiconductive substrate.

The duty cycle modulating D/A converter includes a high frequency clock. When the duty cycle modulating D/A converter is integrated on a common semiconductive substrate with the laser and power controller, difficulties associated with lead inductance and parasitic capacitance which result in expensive packaging for other high frequency circuits is avoided.

In this preferred embodiment, the duty cycle modulating D/A converter includes: a high frequency clock; an N-bit wide register having a clock input coupled to an output of the high frequency clock, an N-bit output and an N-bit input; and a Full Adder having a first N-bit input which receives the N-bit intensity-defining word, an N-bit output coupled to the N-bit input of the N-bit wide register, a second N-bit input coupled to the N-bit output of the N-bit wide register, and a carry-out output which carries the variable duty cycle bitstream output by the D/a converter.

BRIEF DESCRIPTION OF THE DRAWINGS

The invention will be described in detail with reference to the following drawings in which like reference numerals refer to like elements, and wherein:

FIG. 4 is a table illustrating the high frequency output of the FIG. 3 circuit for different values of the intensity controlling N-bit word input where N=3;

DETAILED DESCRIPTION OF THE PREFERRED EMBODIMENTS

Figure 1:
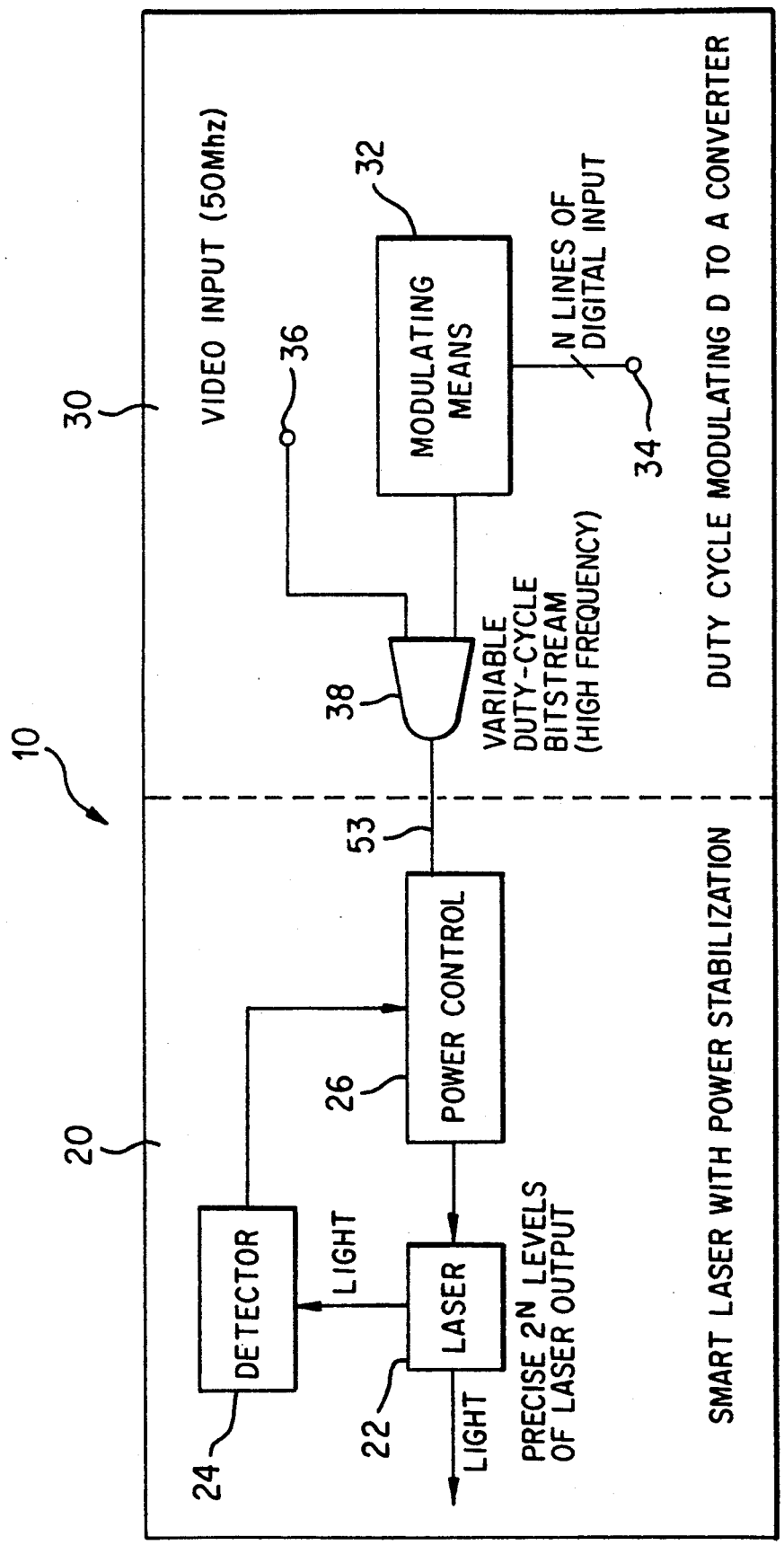
FIG. 1 is a block diagram of the programmable intensity smart laser according to an illustrative embodiment of the present invention.

FIG. 1 illustrates a programmable intensity smart laser 10 according to the present invention. For purposes of description, the programmable intensity smart laser 10 is divided into two portions: a smart laser with power stabilization 20; and a duty cycle modulating D/A converter 30. As will be discussed in more detail below, the smart laser with power stabilization 20 and the duty cycle modulating D/A converter 30 are preferably formed in a common semiconductive substrate.

This eliminates any high frequency off-chip connections.

The power stabilized smart laser, portion 20 includes a semiconductor laser 22, a power controller 26, and, preferably, a photodetector 24 which provides feedback to the power controller 26. The laser 22 and detector 24 can be fabricated in a semiconductive substrate according to the techniques disclosed in the above-incorporated U.S. Pat. Nos. 4,987,468, 5,048,040, or 5,038,185. The power controller 26 outputs an intensity-controlling current to laser 22 based upon the high frequency variable duty cycle bitstream received from D/A converter 30 and, the feedback signal provided by detector 24. Unlike previous devices which vary the peak power applied to the laser, the present invention turns the laser on and off in relation to variations in the duty cycle. The details of power controller 26 will be described below.

The duty cycle modulating D/A converter 30 includes a modulating means 32 which receives an N-bit word as an intensity controlling input signal from receiving means 34 which can, be, for example, an N-line connector. In the illustrative embodiment described below, the N-bit word has three bits, and thus the modulating mean 32 outputs a variable duty cycle bitstream capable of producing eight distinct levels of grey scale. In the embodiment illustrated in FIG. 1, a second receiving means 36, which can be a connector, receives the video input signal. The video input signal can be, for example, a 50 Mhz digital input. Each bit of the digital input defines a pixel frame, or pixel time, during which a single pixel on a substrate which receives the light beam output by laser 22 is imaged. The variable duty cycle bitstream output by modulating means 32 is combined with the video input 36 at AND-gate 38 so that the variable duty cycle bitstream is modulated in accordance with the video signal. The output of AND-gate 38 is provided to power controller 26.

In the FIG. 1 embodiment, the intensity at which pixels are imaged is controlled by the signal received by first receiving means 34, while the video input received by second receiving means 36 determines whether the discrete pixels will be imaged. That is, when the video input is high for a pixel, that pixel will be imaged with the grey scale as controlled by modulating means 32; when the video input is low (indicating that a pixel is not to receive an image), the output of AND-gage 38 will be low. Alternatively, the digital video input could be ANDed with the N-bit digital input prior to receipt of the N-bit input by first receiving means 34. In this case, the output of modulating means 32 can be provided directly to power controller 26. With this alternative embodiment, the input for each bit of the N-bit input received by modulating means 32 will be low when the video signal is low, while the N-bit input will correspond to the desired intensity level when the video signal is high.

Figure 2A:
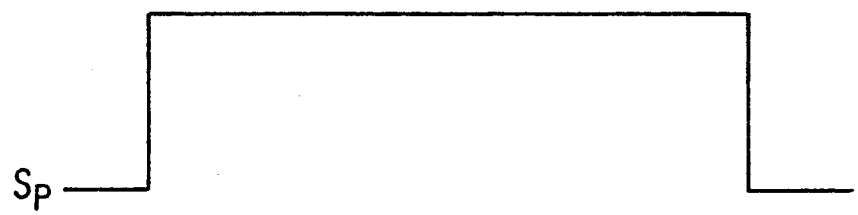
FIG. 2 is a timing chart for describing the functioning of the duty cycle modulating D/A converter of FIG. 1.
Figure 2B:
Figure 2C:
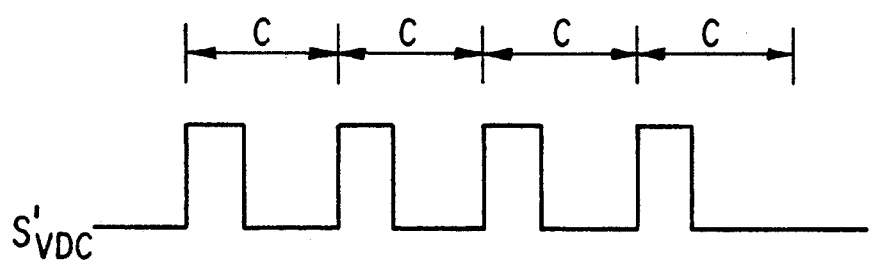

FIG. 2 is a timing chart illustrating the variable duty cycle signal ($S_{VDC}$ or $S'_{VDC}$) produced by modulating means 32 and the video signal ($S_P$). The square wave of signal $S_P$ illustrates one pixel frame in which a single pixel is imaged. If a pixel is to be imaged, the digital video signal is high for the duration of the pixel frame as illustrated by the square wave of signal $S_P$ in FIG. 2. This form of video signal only provides On/Off information to power controller 26. In order to modulate the video signal so that different levels of grey scale are provided, the variable duty cycle signal $S_{VDC}$ or $S'_{VDC}$, as illustrated in FIG. 2, is provided.

A duty cycle, as defined herein, is a repeating cycle of fixed amplitude pulses. The duration of each cycle is illustrated as C in FIG. 2. In the example shown in FIG. 2, the duty cycle repeats four times within a pixel frame. This duty cycle could comprise either: a) a single On/Off pulse, as illustrated by $S'_{VDC}$, wherein the duration of the pulse for each cycle can be varied to vary the grey level; or b) a repeating pattern of ONs and OFFs as illustrated by $S_{VDC}$, wherein each ON pulse has the same duration and the number of pulses in each cycle is varied to vary the grey level. The effect of signals $S_{VDC}$ and $S'_{VDC}$ is substantially the same in that the duty cycle is varied by varying the total ON time of the pulses during each cycle. As illustrated by $S_{VDC}$, this variation can be accomplished by varying the number of fixed amplitude, fixed duration pulses output during each cycle. Alternatively, as illustrated by $S'_{VDC}$, the duration of a single fixed amplitude pulse could be varied. By repeating the duty cycle and outputting enough pulses within each pixel time, the maximum offset between the first and last pulses and the lead and end portion of the pixel signal $S_P$ (also known as "jitter"), respectively, can be made sufficiently small so that the high frequency signal of pulses does not need to be synchronized with the video signal. This requires that at least 2 duty cycles be executed per pixel time.

Figure 3:
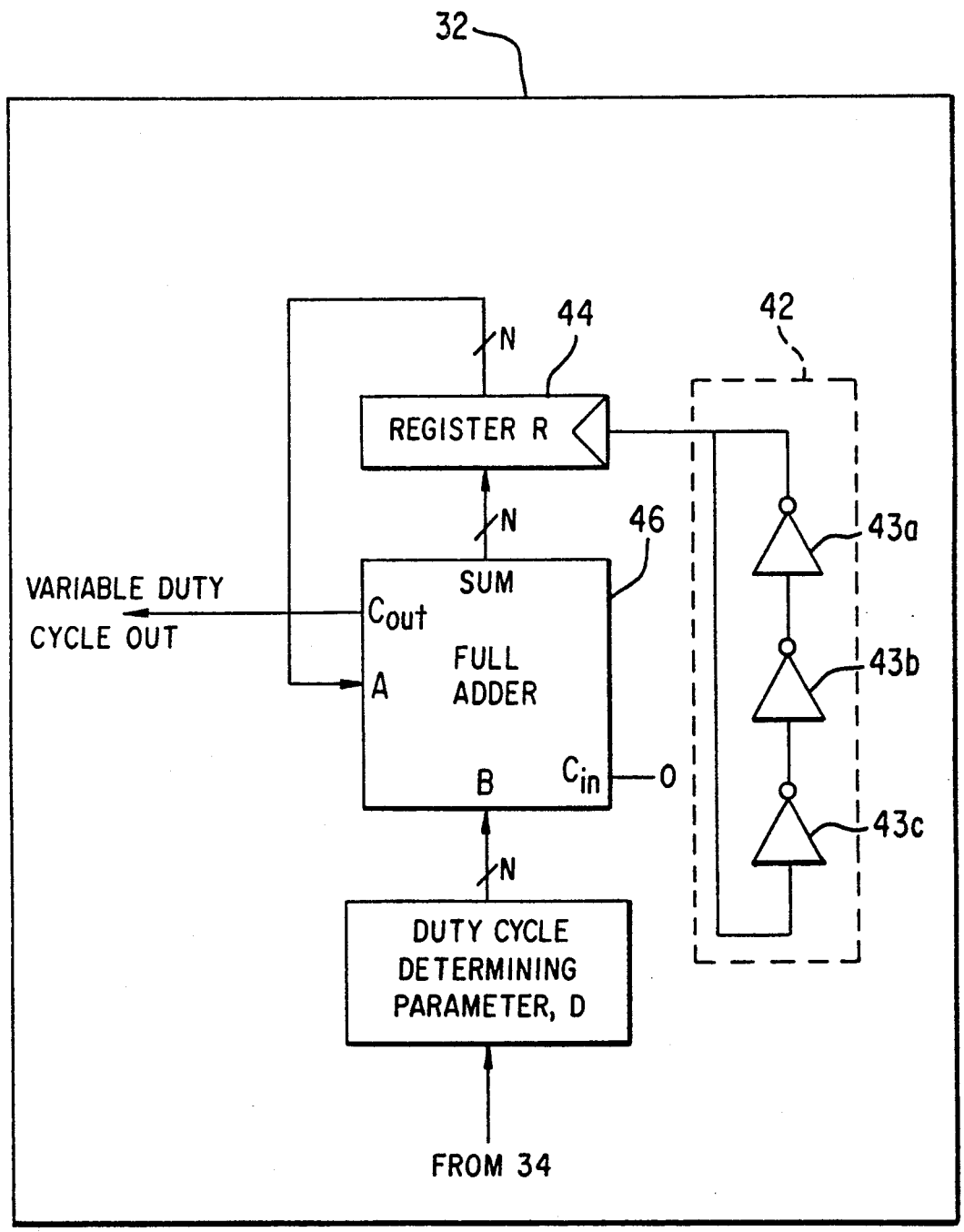
FIG. 3 is a schematic diagram of one embodiment of the modulating means of FIG. 1.

FIG. 3 illustrates one example of the modulating means 32 for receiving an N-bit word and outputting a variable duty-cycle bitstream. The modulating means 32 includes a high frequency (e.g., an 800 Mhz clock) 42, an N-bit wide register 44 (having a width equal to the width of the N-bit wide intensity controlling input word), and a Full Adder 46. The high frequency clock 42 can be comprised of, for example, three inverters 43a, 43b, and 43c. Register 44 includes a clock input coupled to the output of the high frequency clock 42, an N-bit output, and an N-bit input. The Full Adder includes a first N-bit input coupled to the N-bit word receiving means 34, an N-bit output coupled to the N-bit input of the register 44, a second N-bit input coupled to the output of register 44, a carry-in input $C_{in}$, and a carry-out output $C_{out}$ which carries the variable duty cycle bitstream output by modulating means 32 to the power controller 26.

The N-bit input word carries a duty cycle determining parameter (D) which is used to modulate the output of modulating means 32. In the example illustrated in FIGS. 3 and 4, the N-bit input word is a three-bit input word, and thus can define eight distinct levels of grey scale corresponding to values of D from 0-7. In this case, with a register length of 3(N=3), eight clocks are required to be output by high frequency clock 42 before a cycle repetition is guaranteed. For example, in the case where D=3, and starting out with register 44 value equal to 0, after the first clock, register 44 will hold three. After the second clock, register 44 will hold six. After the third clock, register 44 will hold 1, and the carry-out line of the Full Adder will have been asserted. Thus, each time register 44 becomes full, its contents, which are passed to the input of Full Adder 46, will cause the carry-out line $C_{out}$ to be asserted. In this way, D is repeatedly added to the register contents, while the carry-out line of the Full adder will cycle with a duty cycle that is proportional to D.

The carry-out line is used to modulate the laser diode. The input D, a three-bit value in this example, is the duty cycle determining parameter, and can be used to modulate the video input through the AND-gate 38, or it can be the video input itself. In the latter case, there is no need for the AND-gate 38, and the electronics which generates the video data stream would generate three-bit values to feed to the modulating means 32 at, for example, a 50 Mhz rate.

The table of FIG. 4 shows the contents of register 44 after each clock output from clock 42 for each value of D (when N=3). The register value at which carry-out signal $C_{out}$ is output is also indicated in FIG. 4. Thus, the carry-out signals output by Full Adder 46 comprise the high frequency duty cycle. The cycle repeats itself every 8 pulses from clock 42. The total number of fixed (constant) amplitude, fixed (constant) duration pulses output in each cycle varies based on the value of D.

If the high frequency clock 42 were oscillating at 800 Mhz, 16 cycles of the high frequency clock 42 would occur for each single 50 Mhz clock, guaranteeing at least two complete cycles through the eight clock repetition referred to above. This would guarantee good performance of the D/A converter in convolving the data with the laser spot. This assumes that the spot travels its own diameter in about one 50 Mhz clock.

Figure 7A:
FIG. 7 is a timing chart showing a digital video signal, the variable duty cycle bitstream output by the modulating means of FIG. 3 when D=3 for the 3-bit input word, and the signal input to the power controller for the combined video signal and variable duty cycle bitstreams.
Figure 7B:
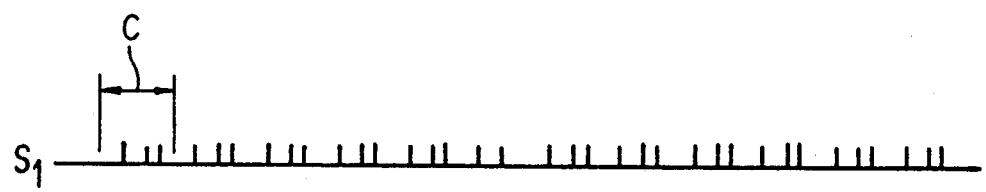
Figure 7C:

FIG. 7 illustrates a 50 Mhz digital video signal $S_P$, the variable duty cycle bitstream $S_1$ output by the FIG. 3 modulating means 32 when D=3 and clock 42 oscillates at 800 Mhz, and the output $S_0$ of AND gate 38. As can be seen, variable duty cycle bitstream $S_1$ has a cycle duration (C) one-half the duration of each pixel time of video signal $S_P$. The signal received by power controller 26 is the output of modulating means 32 when the video signal is high, and is 0 when the video signal is low.

Since the high frequency clock is preferably integrated on the, for example, semiconductive gallium arsenide substrate, there is little problem in obtaining the 800 Mhz clock rate. In fact, the rate is likely to be much higher providing better convolution performance.

In the described example, the clock is generated by 3 inverters in series. Another significant point is that the stability of the clock frequency is of little concern, allowing variation and frequency over microseconds without affecting digital-to-analog performance. This is because digital-to-analog performance is largely determined by the duty cycle, which is substantially unaffected by long term frequency variation.

Figure 5:
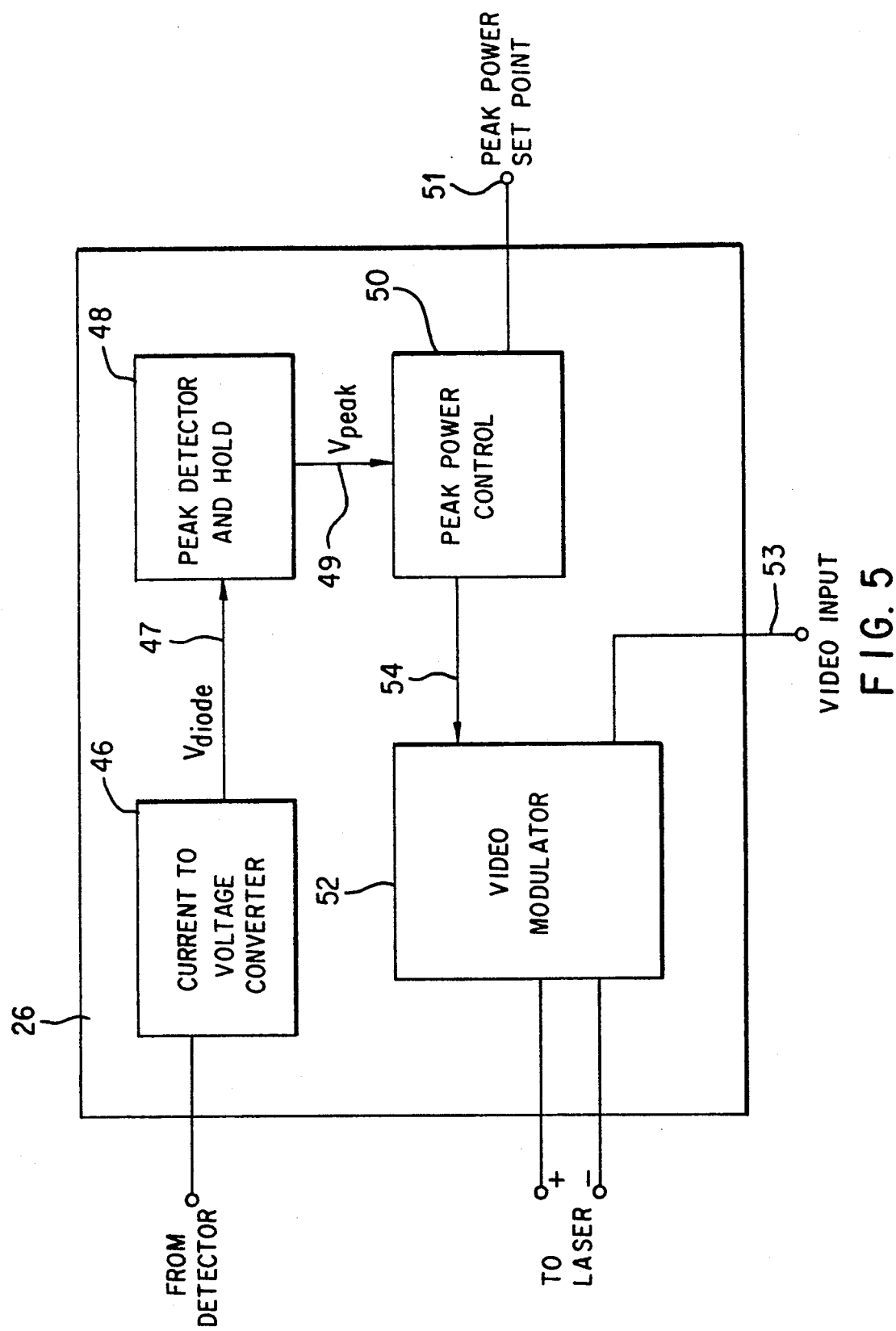
FIG. 5 is a block diagram of one possible power controller as shown in FIG. 1.

FIG. 5 is a block diagram illustrating one possible power controller 26 according to the present invention. The power controller 26 is divided into four portions: a current to voltage converter 46; a peak detector and hold 48; a peak power control 50; and a video modulator 52. The operation of the power controller 26 will be further described below.

Figure 6:
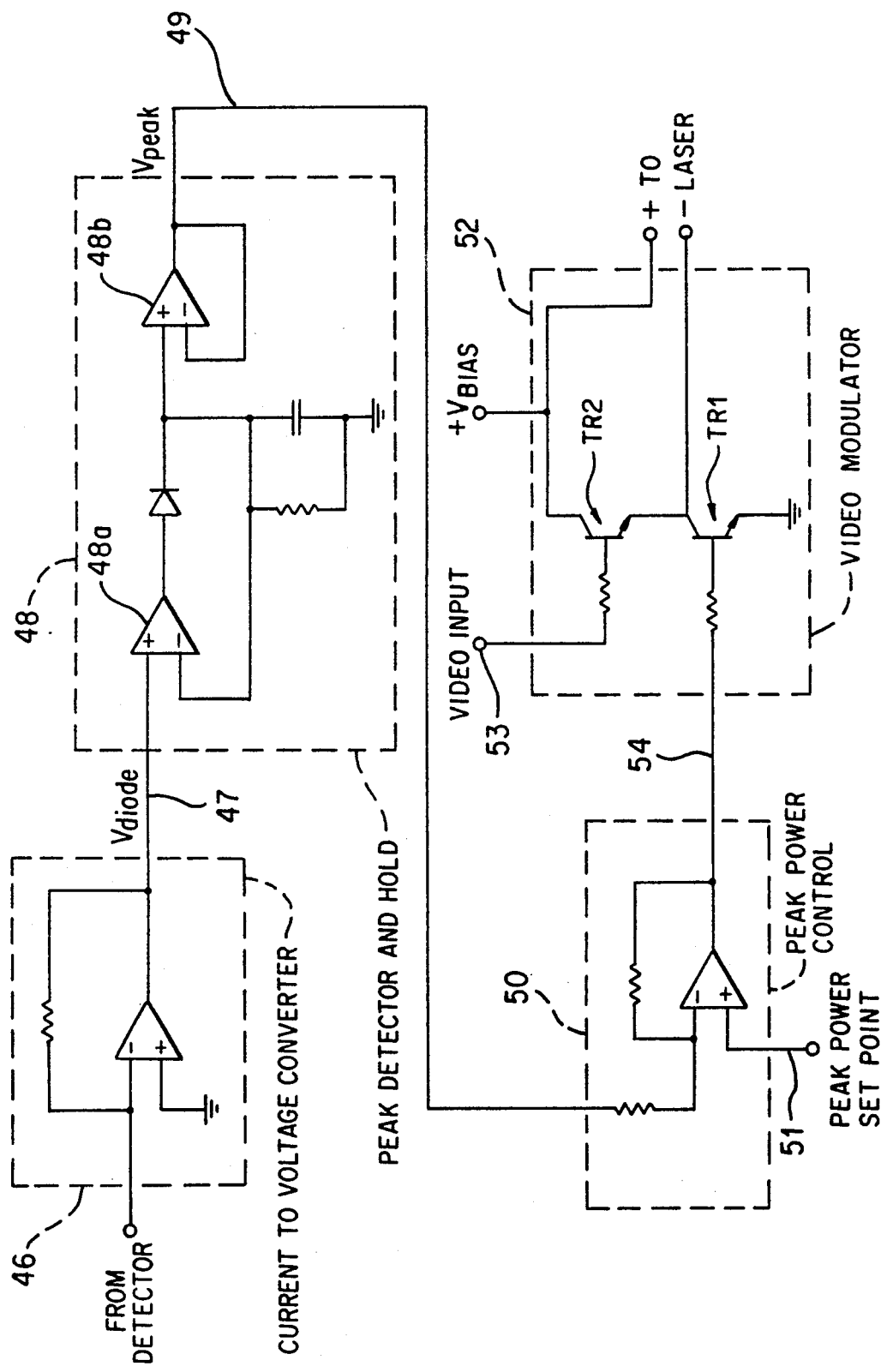
FIG. 6 is a schematic diagram of one possible circuit usable as the power controller in FIG. 5.

FIG. 6 is a schematic diagram illustrating the FIG. 5 power controller 26. The power controller 26 performs two main functions: it provides a feedback loop to monitor and control the peak output power of the laser 22 when the laser 22 is in the ON state; and it provides a means for modulating the laser 22 at high data rates with video information from the duty cycle modulating D/A converter 30.

A portion of the light output from the laser 22 impinges on detector 24, which generates a photocurrent proportional to the output power level of laser 22. This current is converted by the current to voltage converter 46 into a voltage $V_{diode}$ 47. Thus, $V_{diode}$ 47 is proportional to the output power level of laser 22.

Since laser diode 22 is subject to high speed modulation with arbitrary duty cycles, but with a desired peak height, it is necessary to detect the peak height in order to generate a feedback level for laser diode 22. This peak height detection is performed by Peak Detector and Hold 48. The peak detector and hold 48 takes $V_{diode}$ 47 as an input and detects the peak height of $V_{diode}$ 47. This peak height is output as $V_{peak}$ 49. Referring to FIG. 6, the output of the diode after first op-amp 48a follows the peak of the laser output signal, while the second op-amp 48b is a buffer to prevent excessive loading of the output voltage level by the circuitry that follows.

The peak power control 50 has two inputs, $V_{peak}$ 49 and a peak power set point 51. The peak power set point 51 is a signal generated in a conventional manner to establish the desired peak height level of laser 22. Variations between the peak power set point 51 and $V_{peak}$ 49 are output from peak power control 50 along line 54, and are fed back negatively into the laser current control transistor TR1 of the Video Modulator 52. The feedback results in a stabilized peak level for the emitted laser diode pulses.

Video Modulator 52 thus alters the current to laser 22 so as to maintain the peak level of laser 22 substantially constant. The video modulator 52 also performs high-speed modulation of laser 22 by shunting current around laser 22 through video input transistor TR2, as it is switched by video input signal 53 (from the duty cycle modulating D to A converter).

While this invention has been described in conjunction with specific embodiments thereof, it is evident that many alternatives, modifications, and variations will be apparent to those skilled in the art. For example, the duration of each pulse output by modulating means 32 could be varied instead of varying the number of pulses for each cycle. Accordingly, the preferred embodiments of the invention as set forth herein are intended to be illustrative, not limiting. Various changes may be made without departing from the spirit and scope of the invention as defined in the following claims.

What is claimed is:

1. A laser recorder for recording images on a substrate in response to a video signal having a frequency, the inverse of said video signal frequency defining a pixel time during which a single pixel is imaged, said laser recorder comprising:

receiving means for receiving an N-bit signal indicative of a desired intensity level for an image to be formed on the substrate;

modulating means, coupled to said receiving means, for outputting a high frequency variable duty cycle bitstream including a repeating cycle of fixed amplitude pulses, a total duration of the pulses in each cycle varying based on the N-bit signal received by said receiving means, said high frequency of said variable duty cycle being sufficiently high so that said cycle of pulses repeats multiple times within each pixel time;

a semiconductor laser; and power control means, coupled between said modulating means and said semiconductor laser, for receiving said high frequency variable duty cycle bitstream and for outputting an intensity control signal to said semiconductor laser.

2. The laser recorder of claim 1, wherein said receiving means, said modulating means, said semiconductor laser, and said power control means are all formed in a common semiconductive substrate.

3. The laser recorder of claim 1, wherein said modulating means varies the total duration of said fixed amplitude pulses for each cycle by varying a number of said fixed amplitude pulses which are output during each cycle based on said N-bit signal.

4. The laser recorder of claim 1, wherein said modulating means outputs said high frequency variable duty cycle bitstream asynchronously with said video signal.

5. The laser recorder of claim 1, wherein said modulating means includes:
a high frequency clock;
an N-bit wide register having a clock input coupled to an output of said high frequency clock, an N-bit output, and an N-bit input; and
a Full Adder having a first N-bit input coupled to said receiving means, an N-bit output coupled to the N-bit input of said N-bit wide register, a second N-bit input coupled to said N-bit output of said N-bit wide register, and a carry-out output which carries said high frequency variable duty cycle bitstream output by said modulating means.

6. The laser recorder of claim 1, further comprising:
a photodetector, coupled to said power control means, for detecting the intensity of light output by said semiconductor laser and for outputting a feedback signal to said power control means;
wherein said intensity control signal output by said power control means is also based upon said feedback signal.

7. The laser recorder of claim 6, wherein said receiving means, said modulating means, said semiconductor laser, said power control means, and said photodetector are all formed in a common semiconductive substrate.

8. The laser recorder of claim 1, further comprising:
video signal receiving means, coupled to said power control means, for receiving said video signal in the form of a bitstream, wherein said intensity control signal output by said power control means is also based upon said video signal.

9. The laser recorder of claim 8, wherein said power control means includes an AND-gate having a first input coupled to said video signal receiving means and a second input coupled to said modulating means.

10. The laser recorder of claim 1, wherein said power control means varies a current level of said intensity control signal in order to vary the intensity level with which pixels are formed on said substrate by said semiconductor laser.

11. The laser recorder of claim 1, wherein said intensity control signal output by said power control means causes said laser to be switched ON and OFF in accordance with said cycle through multiple repetitions of said cycle within each pixel time.

12. A laser recorder for recording images on a substrate comprising:
first receiving means for receiving an N-bit signal indicative of a desired intensity level of an image to be formed on the substrate;
second receiving means for receiving an input video signal in the form of a bitstream indicative of whether discrete pixels in an image are to be ON or OFF, a duration of each bit of said bitstream defining a pixel time during which a pixel is imaged;
modulating means, coupled to said first receiving means, for outputting a high frequency variable duty cycle bitstream including a repeating cycle of fixed amplitude pulses, a total duration of the fixed amplitude pulses in each cycle varying based on the N-bit signal received by said first receiving means, the cycle of fixed amplitude pulses repeating multiple times within said pixel time;
a semiconductor laser; and
power control means, coupled to said modulating means, said second receiving means, and said semiconductor laser, for receiving said high frequency variable duty cycle bitstream and said input video signal from said second receiving means, and for outputting an intensity control signal to said semiconductor laser.

13. The laser recorder of claim 12, wherein said first receiving means, said second receiving means, said modulating means, said semiconductor laser, and said power control means are all formed in a common substrate.

14. The laser recorder of claim 13, wherein said common substrate is a semiconductive substrate.

15. The laser recorder of claim 12, wherein said modulating means varies the total duration of said fixed amplitude pulses for each cycle by varying a number of said fixed amplitude pulses which are output during each cycle based on said N-bit signal, said fixed amplitude pulses also having a fixed duration.

16. The laser recorder of claim 12, wherein said modulating means outputs said high frequency variable duty cycle bitstream asynchronously with said video signal.

17. The laser recorder of claim 12, wherein said modulating means includes:
a high frequency clock;
an N-bit wide register having a clock input coupled to an output of said high frequency clock, an N-bit output, and an N-bit input; and
a Full Adder having a first N-bit input coupled to said first receiving means, an N-bit output coupled to the N-bit input of said N-bit wide register, a second N-bit input coupled to said N-bit output of said N-bit wide register, and a carry-out output which carries said variable duty cycle bitstream output by said modulating means.

18. The laser reorder of claim 12, further comprising:
a photodetector, coupled to said power control means, for detecting the intensity of light output by said semiconductor laser and for outputting a feedback signal to said power control means;
wherein said intensity control signal output by said power control means is also based upon said feedback signal.

19. The laser recorder of claim 18, wherein said first receiving means, said second receiving means, said modulating means, said power control means, and said photodetector are all formed in a common semiconductive substrate.

20. The laser recorder of claim 12, wherein said power control means includes an AND-gate having a first input coupled to said second receiving means, and a second input coupled to said modulating means.

21. The laser recorder of claim 12, wherein said intensity control signal output by said power control means causes said laser to be switched ON and OFF in accordance with said cycle through multiple repetitions of said cycle within each pixel time.

* * * * *